United States Patent
Moore et al.

(10) Patent No.: US 6,693,345 B2
(45) Date of Patent: *Feb. 17, 2004

(54) SEMICONDUCTOR WAFER ASSEMBLIES COMPRISING PHOTORESIST OVER SILICON NITRIDE MATERIALS

(75) Inventors: John T. Moore, Boise, ID (US); Scott Jeffrey DeBoer, Boise, ID (US); Mark Fischer, Boise, ID (US); J. Brett Rolfson, Boise, ID (US); Annette L. Martin, Boise, ID (US); Ardavan Niroomand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/995,372

(22) Filed: Nov. 26, 2001

(65) Prior Publication Data

US 2002/0047202 A1 Apr. 25, 2002

Related U.S. Application Data

(63) Continuation of application No. 09/724,749, filed on Nov. 27, 2000, which is a division of application No. 09/457,093, filed on Dec. 7, 1999, now Pat. No. 6,323,139, and a continuation-in-part of application No. 09/295,642, filed on Apr. 20, 1999, now Pat. No. 6,297,171, which is a continuation-in-part of application No. 09/057,155, filed on Apr. 7, 1998, now Pat. No. 6,300,253, which is a continuation of application No. 08/567,090, filed on Dec. 4, 1995, now Pat. No. 5,926,739.

(51) Int. Cl.$^7$ .............................. H01L 23/58
(52) U.S. Cl. ................ 257/640; 257/629; 257/632; 257/639
(58) Field of Search .................... 257/629, 632, 257/639, 640

(56) References Cited

U.S. PATENT DOCUMENTS 3,549,411 A   12/1970   Bean
3,649,884 A   3/1972   Haneta (List continued on next page.)

FOREIGN PATENT DOCUMENTS

GB   2129217   5/1984
GB   2145243   3/1985

(List continued on next page.)

OTHER PUBLICATIONS

Silicon Proc. for VLSI: 177–178; vol. 1; S. Wolf.
Silicon Proc. for VLSI; 191–193; vol. 1; S. Wolf.

(List continued on next page.)

*Primary Examiner*—George Eckert
*Assistant Examiner*—N. Drew Richards
(74) *Attorney, Agent, or Firm*—Wells, St. John, P.S.

(57) ABSTRACT

In one aspect, the invention includes a semiconductor processing method, comprising: a) providing a silicon nitride material having a surface; b) forming a barrier layer over the surface of the material, the barrier layer comprising silicon and nitrogen; and c) forming a photoresist over and against the barrier layer. In another aspect, the invention includes a semiconductor processing method, comprising: a) providing a silicon nitride material having a surface; b) forming a barrier layer over the surface of the material, the barrier layer comprising silicon and nitrogen; c) forming a photoresist over and against the barrier layer; d) exposing the photoresist to a patterned beam of light to render at least one portion of the photoresist more soluble in a solvent than another portion, the barrier layer being an antireflective surface that absorbs light passing through the photoresist; and e) exposing the photoresist to the solvent to remove the at least one portion while leaving the other portion over the barrier layer. In yet another aspect, the invention includes a semiconductor wafer assembly, comprising: a) a silicon nitride material, the material having a surface; b) a barrier layer over the surface of the material, the barrier layer comprising silicon and nitrogen; and c) a photoresist over and against the barrier layer.

12 Claims, 6 Drawing Sheets

U.S. PATENT DOCUMENTS

| | | |
|---|---|---|
| 3,884,698 A | 5/1975 | Kakihama et al. |
| 4,075,367 A | 2/1978 | Gulett |
| 4,330,569 A | 5/1982 | Gulett et al. |
| 4,439,270 A | 3/1984 | Powell et al. |
| 4,446,194 A | 5/1984 | Candelaria |
| 4,485,553 A | 12/1984 | Christian |
| 4,499,656 A | 2/1985 | Fabian et al. |
| 4,543,707 A | 10/1985 | Ito et al. |
| 4,612,629 A | 9/1986 | Harari |
| 4,695,872 A | 9/1987 | Chatterjee |
| 4,698,787 A | 10/1987 | Mukherjee et al. |
| 4,732,858 A | 3/1988 | Brewer et al. |
| 4,868,632 A | 9/1989 | Hayashi |
| 4,874,716 A | 10/1989 | Rao |
| 4,939,559 A | 7/1990 | DiMaria et al. |
| 4,996,081 A | 2/1991 | Ellul et al. |
| 5,041,888 A | 8/1991 | Possin et al. |
| 5,045,345 A | 9/1991 | Singer |
| 5,045,847 A | 9/1991 | Tarui et al. |
| 5,098,865 A | 3/1992 | Machado et al. |
| 5,160,998 A | 11/1992 | Itoh et al. |
| 5,178,016 A | 1/1993 | Dauenhauer et al. |
| 5,219,788 A | 6/1993 | Abernathey et al. |
| 5,304,829 A | 4/1994 | Mori et al. |
| 5,306,946 A | 4/1994 | Yamamoto |
| 5,442,223 A | 8/1995 | Fujii |
| 5,489,542 A | 2/1996 | Iwai et al. |
| 5,518,946 A | 5/1996 | Kuroda |
| 5,523,616 A | 6/1996 | Den |
| 5,554,418 A | 9/1996 | Ito et al. |
| 5,587,344 A | 12/1996 | Ishikawa |
| 5,756,404 A | 5/1998 | Friedenreich et al. |
| 5,773,325 A | 6/1998 | Teramoto |
| 5,795,821 A | 8/1998 | Bacchetta et al. |
| 5,831,321 A | 11/1998 | Nagayama |
| 5,834,374 A | 11/1998 | Cabral, Jr. et al. |
| 5,877,069 A | 3/1999 | Robinson |
| 5,882,978 A | 3/1999 | Srinivasan et al. |
| 5,891,793 A | 4/1999 | Gardner et al. |
| 5,904,523 A | 5/1999 | Feldman et al. |
| 5,918,147 A | 6/1999 | Filipiak et al. |
| 5,925,494 A | 7/1999 | Horn |
| 5,926,739 A | 7/1999 | Rolfson et al. |
| 5,985,771 A | 11/1999 | Moore et al. |
| 6,093,956 A | 7/2000 | Moore et al. |
| 6,103,619 A | 8/2000 | Lai |
| 6,140,181 A | 10/2000 | Forbes et al. |
| 6,143,627 A | 11/2000 | Robinson |
| 6,143,662 A | 11/2000 | Rhoades et al. |
| 6,265,241 B1 | 7/2001 | Pan |
| 6,300,253 B1 | 10/2001 | Moore |
| 6,417,559 B1 * | 7/2002 | Moore et al. ............... 257/640 |

FOREIGN PATENT DOCUMENTS

| | | |
|---|---|---|
| GB | 2170649 | 8/1986 |
| JP | 362137854 | 6/1987 |
| JP | 401086562 | 3/1989 |
| JP | 403075158 | 3/1991 |

OTHER PUBLICATIONS

Silicon Proc. for VLSI; 37–38; 598–599; vol. 2; S. Wolf.

Electronic Materials Science: For Integrated Circuits; 1990 ©; Mayer et al; pp. 269–274; Pub. 1990.

Intrinsic Stress in Silicon Nitride and Silicon Dioxide Films Prepared by Various Deposition Techniques; 1988 IEEE Internatl. Sympos. On Electrical Insulation, Boston, MA; Jun. 5–8, 1988; 1 page; Kanicki, J. et al.

Passivation of GaAsFET's with PECVD Silicon Nitride Films of Different Stress States; IEEE Transactions on Electron Devices; vol. 35, No. 9; Sep. 1988; pp. 1412–1418.

Silicon Nitride Overcoats for Thin Film Magnetic Recording Media; IEEE Transactions on Magnetics; vol. 27. No. 6, Nov. 1991; pp. 5070–5072.

U.S. patent application Ser. No. 09/031,251, Lam et al., filed Feb. 1998.

* cited by examiner

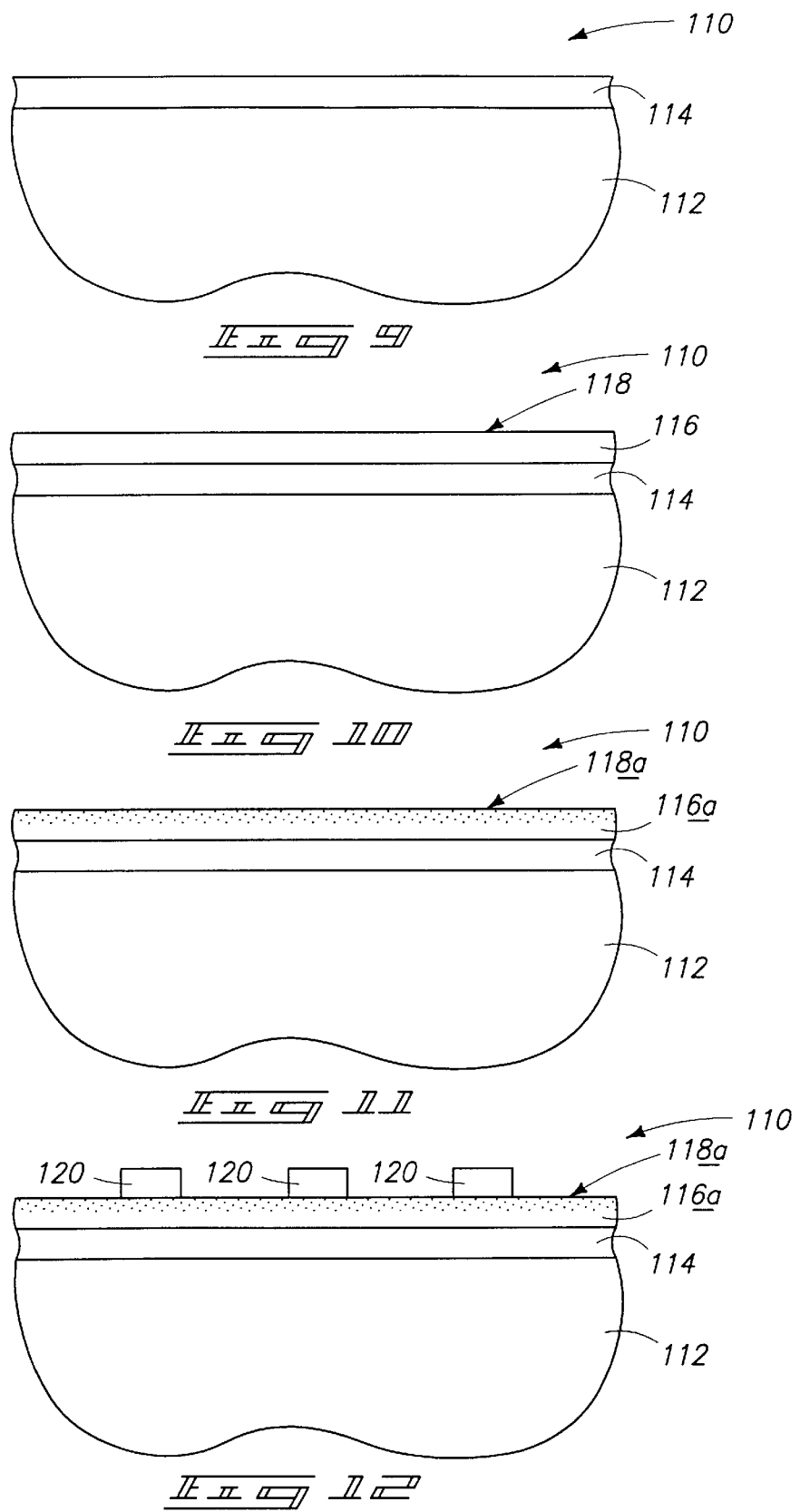

SEMICONDUCTOR WAFER ASSEMBLIES COMPRISING PHOTORESIST OVER SILICON NITRIDE MATERIALS

This application resulted from a continuation application of U.S. patent application Ser. No. 09/724,749, which was filed on Nov. 27, 2000 which is a divisional application of U.S. patent application Ser. No. 09/457,093, which was filed Dec. 7, 1999 now U.S. Pat. No. 6,323,139; and which is a continuation-in-part of U.S. Patent application Ser. No. 09/057,155, filed Apr. 7, 1998 now U.S. Pat. No. 6,300,253; and a continuation-in-part of U.S. patent application Ser. No. 09/295,642 filed Apr. 20, 1999, now U.S. Pat. No. 6,297,171; which is a continuation of U.S. patent application Ser. No. 08/567,090 filed Dec. 4, 1995, now U.S. Patent No. 5,926,739.

TECHNICAL FIELD

The invention pertains to methods of forming and patterning photoresist over silicon nitride materials, and to semiconductor wafer assemblies comprising photoresist over silicon nitride materials. The invention also relates generally to semiconductor processing methods of promoting adhesion of photoresist to an outer substrate layer predominantly comprising silicon nitride.

BACKGROUND OF THE INVENTION

Silicon nitride is frequently utilized in modern semiconductor fabrication methods. For instance, silicon nitride is an insulative material, and can be utilized to electrically isolate conductive components from one another. Also, silicon nitride is selectively etchable relative to other materials utilized in semiconductor fabrication processes, such as, for example, silicon dioxide, and is can thus be utilized as an etch stop material. Another example use of silicon nitride is for LOCOS (LOCal Oxidation of Silicon). LOCOS comprises growing oxide over field regions of a semiconductor substrate, while not growing the oxide over other regions of the substrate. The other regions of the substrate are typically protected by a thin layer of silicon nitride during the oxide growth.

In many applications of silicon nitride, a silicon nitride layer is patterned into a specific shape. An example prior art patterning process is described with reference to FIGS. 1–2. Referring to FIG. 1, a semiconductor wafer fragment 10 comprises a substrate 12 covered by a pad oxide layer 14, a silicon nitride layer 16, an antireflective coating 18, and a photoresist layer 20.

Substrate 12 can comprise, for example, monocrystalline silicon lightly doped with a p-type dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Pad oxide 14 is a thin layer (from about 40 to about 50 nanometers thick) of silicon dioxide, and is provided to alleviate stresses that can be caused by silicon nitride layer 16. Pad oxide 14 can be formed by exposing a silicon-comprising substrate 12 to an oxidizing atmosphere.

Silicon nitride layer 16 can be formed over pad oxide 14 by, for example, chemical vapor deposition. A thickness of silicon nitride layer 16 will vary depending on the application of the silicon nitride layer. In LOCOS fabrication processes, silicon nitride layer 16 will typically be provided to a thickness of from about 100 nanometers to about 200 nanometers.

Antireflective coating 18 is a polymer film provided over silicon nitride layer 16 for two purposes. First, antireflective coating 18 absorbs light during photolithographic patterning of photoresist layer 20. Such absorption can prevent light that has passed through photoresist layer 20 from reflecting back into the layer to constructively or destructively interfere with other light passing through layer 20. Second, antireflective coating 18 functions as a barrier to prevent diffusion of nitrogen atoms from silicon nitride layer 16 into photoresist layer 20. It is found that if nitrogen atoms diffuse into photoresist 20, they can alter its sensitivity to light (so-called "poisoning" of the photoresist).

Photoresist layer 20 is provided to form a pattern over silicon nitride layer 16. Photoresist layer 20 comprises a polymer composition which becomes selectively soluble in a solvent upon exposure to light. If photoresist 20 comprises a negative photoresist, it is rendered insoluble in a solvent upon exposure to light, and if it comprises a positive photoresist, it is rendered soluble in solvent upon exposure to light.

Referring to FIG. 2, photoresist layer 20 is exposed to a patterned beam of light to selectively render portions of the photoresist soluble in a solvent, while leaving other portions insoluble. After such exposure, the solvent is utilized to selectively remove portions of photoresist layer 20 and thereby convert photoresist layer 20 into the pattern shown.

Referring to FIG. 3, the pattern from layer 20 is transferred to underlying layers 18, 16 and 14 by an appropriate etch. A suitable etch can comprise, for example, a plasma-enhanced etch utilizing $NF_3$ and HBr. In subsequent processing which is not shown, antireflective coating layer 18 and photoresist layer 20 can be removed to leave stacks comprising pad oxide 14 and silicon nitride 16 over substrate 12. The stacks can then be utilized for subsequent fabrication processes. For instance, the stacks can be utilized for LOCOS by subsequently exposing wafer fragment 10 to oxidizing conditions to grow field oxide between the stacks. As another example, conductive metal layers may be provided between the stacks, and the stacks utilized for electrical isolation of such metal layers.

The above-described processing sequence requires formation of four distinct layers (14, 16, 18, and 20), each of which is formed by processing conditions significantly different than those utilized for formation of the other three layers. For instance, antireflective coating 18 is commonly formed by a spin-on process, followed by a bake to remove solvent from the layer. In contrast, silicon nitride layer 16 is typically formed by a chemical vapor deposition process. The spin-on and baking of layer 18 will typically not occur in a common chamber as the chemical vapor deposition of layer 16, as processing chambers are generally not suited for such diverse tasks. Accordingly, after formation of silicon nitride layer 16, semiconductor wafer fragment 10 is transferred to a separate processing chamber for formation of antireflective coating 18. The semiconductive wafer fragment 10 may then be transferred to yet another chamber for formation of photoresist layer 20.

A continuing goal in semiconductive wafer fabrication processes is to minimize processing steps, and particularly to minimize transfers of semiconductive wafers between separate processing chambers. Accordingly, it would be desirable to develop alternative fabrication processes wherein fabrication steps could be eliminated.

It has been attempted to pattern silicon nitride layers without utilizing an antireflective coating over the layers. However, such creates complications, such as those illustrated in FIG. 4. Identical numbering is utilized in FIG. 4 as was utilized with reference to FIGS. 1–3, with differences indicated by the suffix "a". A difference between the semiconductive wafer fragment 10a of FIG. 4 and the wafer fragment 10 of FIGS. 1–3 is that antireflective coating 18 is eliminated from the wafer fragment 10a construction. Wafer fragment 10a of FIG. 4 is shown at a processing step analogous to the processing step shown in FIG. 2. Elimination of antireflective coating layer 18 has enabled nitrogen atoms to diffuse from silicon nitride layer 16 into a lower portion of photoresist layer 20a. The nitrogen atoms have altered the photoresist such that regions which should be removed by exposure to a solvent are no longer removable by the solvent. This can render semiconductive wafer fragment 10a unsuitable for the further processing described above with reference to FIG. 3. It would be desirable to develop alternative methods of forming photoresist over silicon nitride which avoid the adverse effects illustrated in FIG. 4.

Traditional silicon nitride layers have stoichiometries of about $Si_3N_4$. Silicon enriched silicon nitride layers (i.e., silicon nitride layers having a greater concentration of silicon than $Si_3N_4$, such as, for example, $Si_4N_4$) have occasionally been used in semiconductor fabrication processes. The silicon enriched silicon nitride was utilized as a layer having a substantially homogenous composition throughout its thickness, although occasionally a small portion of the layer (1% or less of a thickness of the layer) was less enriched with silicon than the remainder of the layer due to inherent deposition problems.

When the silicon enriched silicon nitride layers were utilized in a process such as that shown in FIG. 4 (i.e., a process wherein no antireflective coating layer is provided between the silicon nitride and the photoresist), it was found that good photolithographic patterning of the photoresist could be obtained. However, it was also found that the silicon nitride was difficult to pattern due to a resistance of the silicon nitride to etching. Accordingly, it would be desired to develop alternative methods of utilizing silicon nitride in wafer fabrication processes.

In additional aspect of the prior art, microcircuit fabrication involves provision of precisely controlled quantities of impurities into small regions of a silicon substrate, and subsequently interconnecting these regions to create components and integrated circuits. The patterns that define such regions are typically created by a photolithographic process. Such processing sets the horizontal dimensions on the various parts of the devices and circuits. Photolithography is a multistep pattern transfer process similar to stenciling or photography. In photolithograpy, the required pattern is first formed in reticles or photomasks and transferred into the surface layer(s) of the wafer through photomasking steps.

Inherent in photolithograpy is application and adherence of photoresist materials to underlying substrates. The resist must be capable of adhering to these surfaces through all the resist processing and etch steps. Poor adhesion brings about severe undercutting, loss of resolution, or possibly the complete loss of the pattern. Wet etching techniques demand a high level of adhesion of the resist film to the underlying substrates.

Various techniques are used to increase the adhesion between resist and a substrate such as, a) dehydration baking prior to coating; b) use of hexamethyldisilazane (HMDS) and vapor priming systems to promote resist adhesion for polysilicon, metals and $SiO_2$ layers, and c) elevated temperature post-bake cycles. HMDS functions as an effective adhesion promoter for silicon and silicon oxide containing films, but provides effectively no surface-linking adhesion promotion with respect to silicon nitride films.

Accordingly, it would be desirable to develop alternate and improved techniques for providing better adhesion of photoresist to silicon nitride films.

SUMMARY OF THE INVENTION

In one aspect, the invention encompasses a semiconductor processing method of forming a photoresist over a silicon nitride material. The silicon nitride material has a surface. A barrier layer comprising silicon and nitrogen is formed over the surface. The photoresist is formed over and against the barrier layer.

In another aspect, the invention encompasses a semiconductor processing method of forming and patterning a photoresist layer over a silicon nitride material. The silicon nitride material has a surface. A barrier layer comprising silicon and nitrogen is formed over the surface. The photoresist is formed over and against the barrier layer. The photoresist is exposed to a patterned beam of light to render at least one portion of the photoresist more soluble in a solvent than an other portion. The barrier layer is an antireflective surface that absorbs light passing through the photoresist. The photoresist is exposed to the solvent to remove the at least one portion while leaving the other portion over the barrier layer.

In yet another aspect, the invention encompasses a semiconductor wafer assembly. The assembly includes a silicon nitride material, a barrier layer over a surface of the material, and a photoresist over and against the barrier layer. The barrier layer comprises silicon and nitrogen.

BRIEF DESCRIPTION OF THE DRAWINGS

Preferred embodiments of the invention are described below with reference to the following accompanying drawings.

FIG. 9 is a diagrammatic sectional view of a semiconductor wafer fragment at one processing step in accordance with the invention.

FIG. 10 is a view of the FIG. 9 wafer fragment at a processing step subsequent to that shown by FIG. 9.

FIG. 11 is a view of the FIG. 9 wafer fragment at a processing step subsequent to that shown by FIG. 10.

FIG. 12 is a view of the FIG. 9 wafer fragment at a processing step subsequent to that shown by FIG. 11.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
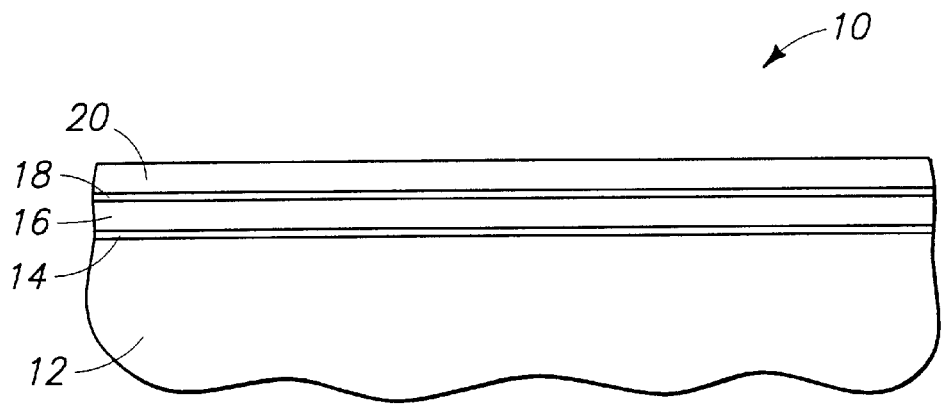
FIG. 1 is a diagrammatic, fragmentary, cross-sectional view of a semiconductor wafer fragment at a preliminary step of a prior art processing sequence.
Figure 2:
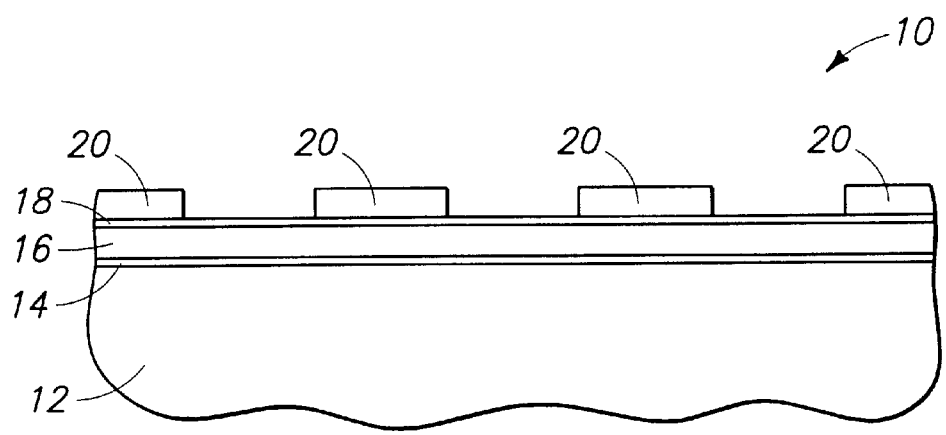
FIG. 2 is a view of the FIG. 1 wafer fragment shown at a processing step subsequent to that of FIG. 1.
Figure 3:
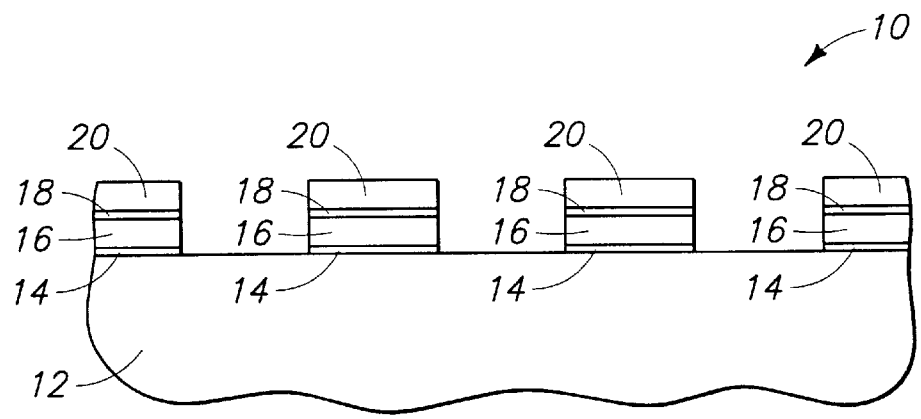
FIG. 3 is a view of the FIG. 1 wafer fragment shown at a processing step subsequent to that of FIG. 2.
Figure 4:
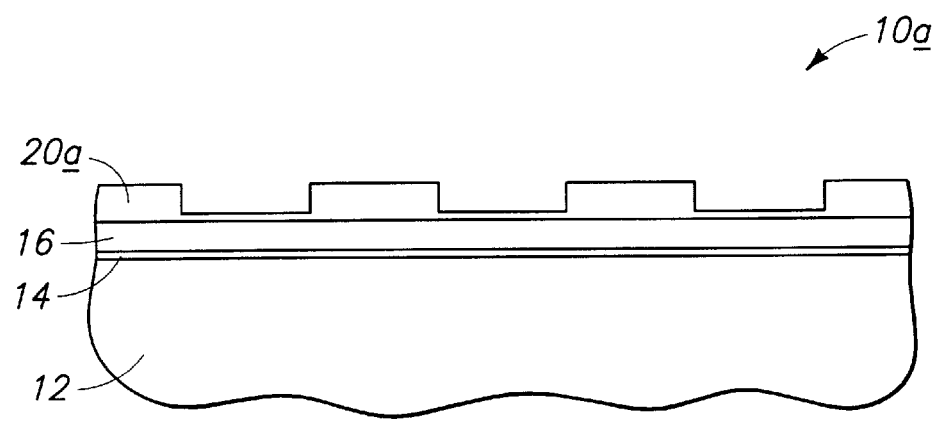
FIG. 4 is a diagrammatic, fragmentary, cross-sectional view of a prior art wafer fragment processed according to a second prior art processing sequence.
Figure 5:
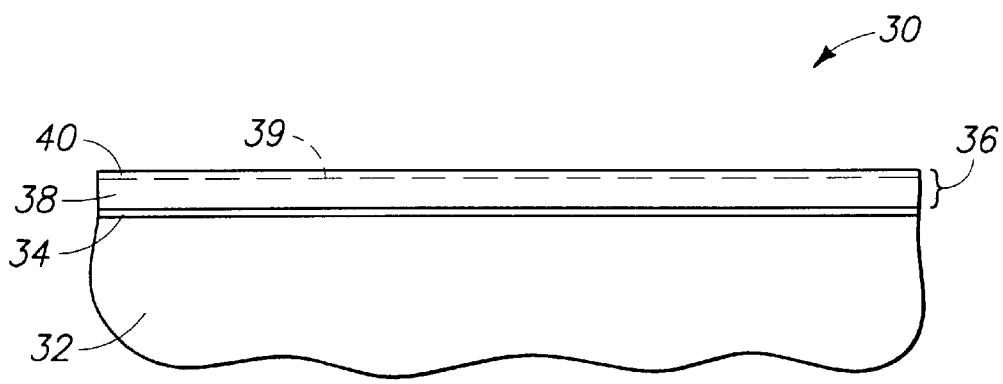
FIG. 5 is a diagrammatic, fragmentary, cross-sectional view of a semiconductor wafer fragment at a preliminary processing step of a method of the present invention.

A semiconductor processing method of the present invention is described with reference to FIGS. 5–8. Referring first to FIG. 5, a semiconductor wafer fragment 30 comprises a substrate 32, a pad oxide layer 34 and a silicon nitride layer 36. Substrate 32 and pad oxide layer 34 can comprise identical compositions to those discussed above in the "background" section regarding prior art substrate 12 and prior art pad oxide 14. Silicon nitride layer 36 differs from the prior art silicon nitride layer 16 (discussed in the "background" section) in that silicon nitride layer 36 comprises two distinct portions 38 and 40, having different compositions. A dashed line 39 is utilized to indicate an interface between portions 38 and 40. Portion 40 is a nitrogen barrier layer formed over portion 38, and is preferably thinner than portion 38 so that the majority of silicon nitride layer 36 has the properties of portion 38. Portion 40 can comprise, for example, a thickness of less than or equal to about 5 nanometers, and portion 38 can comprise, for example, a thickness of greater than 95 nanometers.

Each of portions 38 and 40 preferably comprises silicon and nitrogen, but portion 40 preferably comprises a lower percentage of nitrogen than portion 38. Portion 38 can comprise, for example, a traditional silicon nitride composition, such as a composition having a stoichiometry of about $Si_3N_4$. Such traditional silicon nitride material can be formed by, for example, chemical vapor deposition. Portion 40 can comprise, for example, a silicon nitride material enriched in silicon relative to the material of portion 38. For example, portion 40 can comprise a stoichiometry of $Si_xN_y$, where in x is greater than or equal to y. Example stoichiometries of portion 40 are $Si_4N_4$, $Si_7N_4$ and $Si_{10}N_1$.

Portion 40 is preferably formed from a silicon precursor gas and a nitrogen precursor gas in a common and uninterrupted deposition process with portion 38. By "common deposition process" it is meant a deposition process wherein a wafer is not removed from a reaction chamber between the time that an initial portion of a silicon nitride layer is formed and the time that a final portion of the silicon nitride layer is formed. By "uninterrupted deposition process" it is meant a process wherein the flow of at least one of the silicon precursor gas and the nitrogen precursor gas does not stop during the deposition process.

An example deposition process for forming silicon nitride layer 36 is a chemical vapor deposition (CVD) process utilizing $SiH_2Cl_2$ (dichlorosilane) as a silicon precursor gas, and $NH_3$ (ammonia) as a nitrogen precursor gas. Substrate 32 is provided within a CVD reaction chamber, together with the dichlorosilane and ammonia. A pressure within the chamber is, for example, from about 100 mTorr to about 1 Torr, and a temperature within the chamber is, for example, from about 700° C. to about 800° C.

The dichlorosilane and ammonia are provided in the chamber to a first ratio, and such first ratio is utilized to deposit portion 38. The first ratio can be, for example, 0.33 to form a portion 38 have a stoichiometry of about $Si_3N_4$. After portion 38 is formed, the ratio of dichlorosilane to ammonia is altered to a second ratio having an increased relative amount of dichlorosilane. Such second ratio of dichlorosilane to ammonia is utilized to form second portion 40. An example second ratio is about 6, which forms a silicon nitride portion 40 having a stoichiometry of $Si_xN_y$, wherein the ratio of x to y is greater than 1.

An alternative method of forming a nitrogen barrier portion 40 of silicon nitride layer 36 is to form the portion 40 from silicon, oxygen and nitrogen. For instance, portion 40 can comprise silicon oxynitride having a stoichiometry of $Si_xN_yO_z$, wherein x, y and z are greater than or equal to 1 and less than or equal to 5. An example composition of the silicon oxynitride is $Si_3N_4O_2$.

The silicon oxynitride can be formed by exposing silicon nitride portion 38 to an atmosphere comprising oxygen. The oxygen can be in the form of, for example, one or more of ozone, NO or $N_2O$. Methods for utilizing an atmosphere comprising oxygen to form silicon oxynitride over silicon nitride portion 30 include, for example, plasma-enhanced chemical vapor deposition, rapid thermal processing, high pressure oxidation and low pressure oxidation. For the purposes of interpreting this disclosure and the claims that follow, high pressure oxidation is defined as oxidation occurring at pressures of 1 atmosphere and above, and low pressure oxidation is defined as oxidation occurring at pressures of less than 1 atmosphere. Example temperatures for forming silicon oxynitride by high pressure oxidation are from about 600° C. to about 900° C., and example temperatures forming silicon oxynitride by low pressure oxidation are from about 700° C. to about 1000° C. Example conditions for forming silicon oxynitride by rapid thermal processing comprise a temperature of from about 700° C. to about 1000° C. and a ramp rate of from about 20° C./second to about 100° C./second.

If the silicon oxynitride is formed by chemical vapor deposition of silicon, oxygen, and nitrogen, it can be formed in a common and uninterrupted chemical vapor deposition process with portion 38. For example, portion 38 can be formed in a CVD reaction chamber from a first ratio of a silicon precursor gas and a nitrogen precursor gas. Subsequently, an oxygen precursor gas can be introduced into the reaction chamber. The oxygen precursor gas, silicon precursor gas and nitrogen precursor gas can, in combination, form a silicon oxynitride portion 40 over silicon nitride portion 38.

Figure 6:
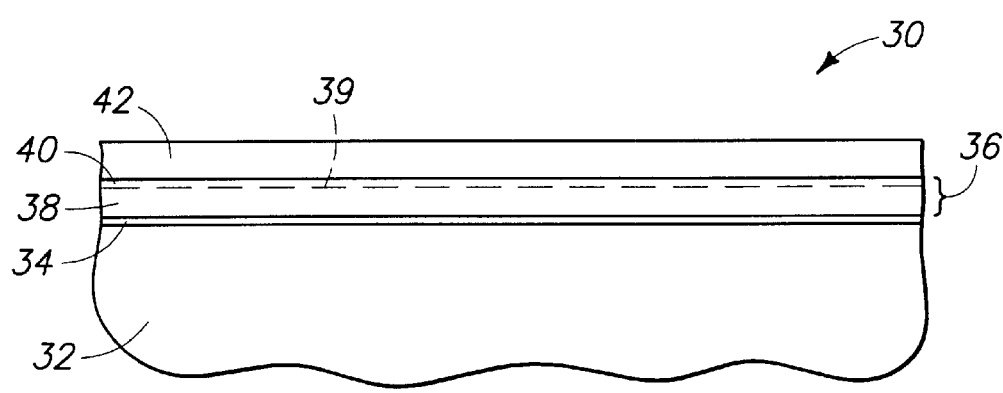
FIG. 6 is a view of the FIG. 5 wafer fragment shown at a processing step subsequent to that of FIG. 5.

Referring to FIG. 6, a photoresist 42 is formed over silicon nitride 8 layer 36. In the shown preferred embodiment, there is no antireflective coating formed between silicon nitride layer 36 and photoresist 42. Instead, photoresist 42 is formed directly against upper portion 40 of silicon nitride layer 36.

Figure 7:
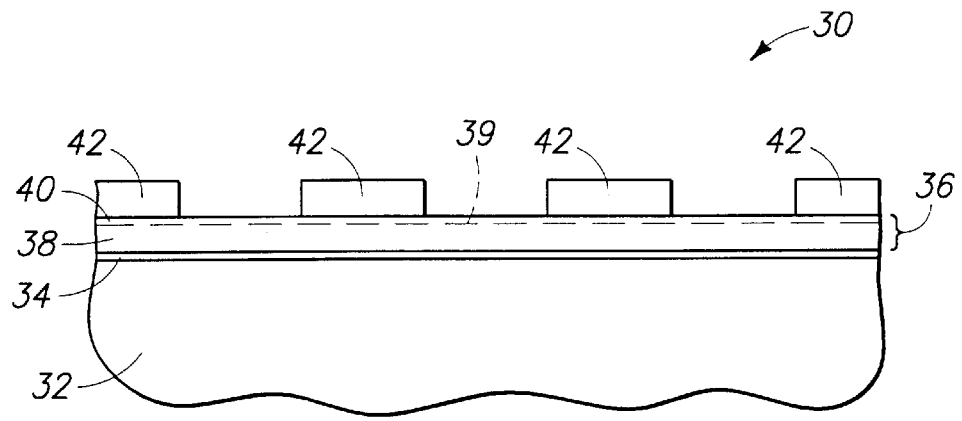
FIG. 7 is a view of the FIG. 5 wafer fragment shown at a processing step subsequent to that of FIG. 6.

Referring to FIG. 7, photoresist 42 is exposed to a patterned beam of light to render portions of photoresist 42 more soluble in a solvent than other portions. The more soluble portions are then removed with the solvent to pattern photoresist 42.

During the exposure of photoresist 42 to the beam of light, portion 40 of silicon nitride layer 36 can be an antireflective surface. It is found that a refractive index of a silicon nitride material increases as the stoichiometric amount of silicon within the material is increased. Silicon nitride materials having stoichiometries of $Si_xN_y$, wherein x is greater than or equal to y, have refractive indices of greater than or equal to about 2.2. Such silicon nitride materials can effectively function as antireflective coatings. In contrast, traditional silicon nitride materials (i.e., silicon nitride materials having stoichiometries of $Si_3N_4$) have refractive indices of less than 2.0, and do not function as effective antireflective surfaces.

Figure 8:
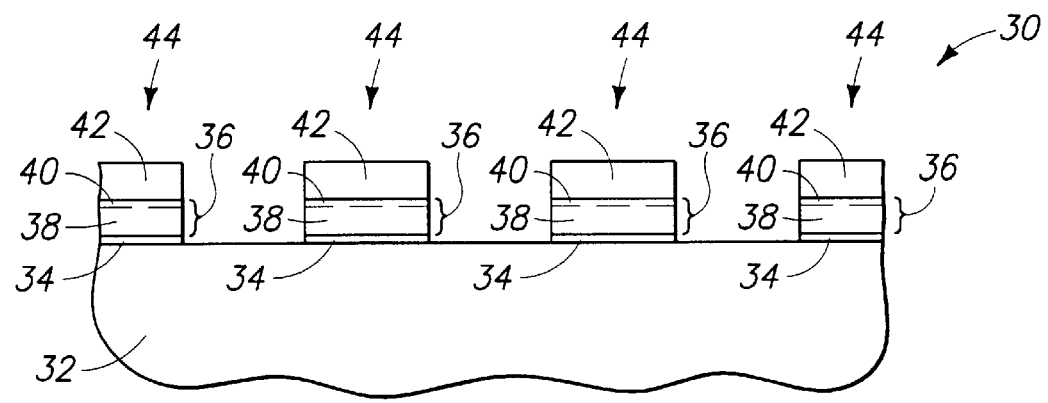
FIG. 8 is a view of the FIG. 5 wafer fragment shown at a processing step subsequent to that of FIG. 7.

Referring to FIG. 8, the pattern of photoresist 42 is transferred to silicon nitride layer 36 and pad oxide 34 to form stacks 44 comprising pad oxide 34, silicon nitride 36 and patterned photoresist 42. The transferring of a pattern from photoresist 42 to layers 34 and 36 can comprise, for example, an etch utilizing $NF_3$ and HBr. The susceptibility of a silicon nitride layer to etching generally decreases as the silicon nitride layer becomes more enriched with silicon. Thus, the removability of a silicon nitride layer can be adjusted by adjusting the relative proportions of silicon enriched portions to non-silicon enriched portions. Specifically, silicon nitride layers having a higher proportion of less silicon enriched portions to heavily silicon enriched portions can be easier to remove in subsequent wafer processing. Example etch conditions which proceed slower with respect to an silicon enriched silicon nitride relative to a silicon nitride having a lower stoichiometric amount of silicon are etching in hot phosphoric acid, or etching in dilute hydrofluoric acid (wherein "dilute" refers to a hydrofluoric acid solution comprising less than 50% hydrofluoric acid (by weight)).

In subsequent processing which is not shown, photoresist 42 can be removed from over stacks 44. Additional processing can be utilized to form field oxide between stacks 44, or to form conductive materials electrically isolated by the insulative stacks 44.

Other embodiments of the invention are described with reference to FIGS. 9–15. Referring first to FIGS. 9–12, and initially to FIG. 9, a semiconductor wafer fragment in process is indicated generally with reference numeral 110. Such includes a substrate composed of a bulk monocrystalline silicon substrate 112 and an overlying insulating layer 114, such as $SiO_2$. An example thickness for layer 114 is from 50 Angstroms to 300 Angstroms.

Referring to FIG. 10, an outer layer 116 of $Si_3N_4$ is provided outwardly of substrate 112/114. Nitride layer 116 includes an outer surface 118. Thickness of layer 116 will depend upon the application. For example where layer 116 is merely functioning as an etch stop in some later process step, its thickness may approximate 100 Angstroms or less. Where layer 116 is being used as a mask for a local oxidation of silicon (LOCOS), layer 116 thickness may be from 1500 Angstroms to 3000 Angstroms.

The preferred manner of depositing or otherwise providing nitride layer 116 is by chemical vapor deposition within a chemical vapor deposition reactor using a gaseous silicon containing precursor and a gaseous nitrogen containing precursor. An example preferred nitride precursor is dichlorosilane (DCS), with a preferred nitrogen containing precursor being ammonia ($NH_3$). One example set of deposition parameters includes maintaining reactor temperature and pressure at 780° C. and 250 mTorr, respectively, with the precursors being provided at a volumetric ratio of $DCS:NH_3$ at 1:3. Such is but one example set of conditions effective to deposit a $Si_3N_4$ layer on substrate 114/112.

Referring to FIG. 11, the gas flow of the nitrogen containing precursor to the chemical vapor deposition reactor is reduced, thus increasing the concentration of the silicon component of the precursor. This will have the effect of enrichening the $Si_3N_4$ layer outermost surface 118 to outermost surface 118a with silicon atoms, as depicted by the dots in the FIG. 11, to provide increased silicon concentration beyond the empirical stoichiometric relationship of silicon to nitride atoms in molecular silicon nitride. Thus, the outer silicon nitride surface has been transformed into a material (i.e. silicon enrichened $Si_3N_4$) which can effectively be used to promote subsequent adhesion of photoresist to $Si_3N_4$ layer 116a. Silicon is a material to which photoresist will more readily adhere than $Si_3N_4$. An example reduction from the 1:3 $DCS:NH_3$ ratio to achieve such enrichening is to a ratio of from 1:0 to 1:1.25.

Referring to FIG. 12, a layer of photoresist is deposited over silicon enrichened outer $Si_3N_4$ surface 118a, and is for example patterned as shown to produce photoresist blocks 120. Silicon enrichened outer surface 118a can optionally be treated with suitable other adhesion primers appropriate to silicon, such as HMDS. Regardless, a desired result is photoresist material 120 adhering to $Si_3N_4$ layer 116a with a greater degree of adhesion than would otherwise occur if the outer $Si_3N_4$ surface 118 were not transformed by silicon enrichening. All of the above described processing preferably and advantageously occurs in the same single chemical vapor deposition reactor. Alternately, more than one reactor chamber can be used.

Figure 13:
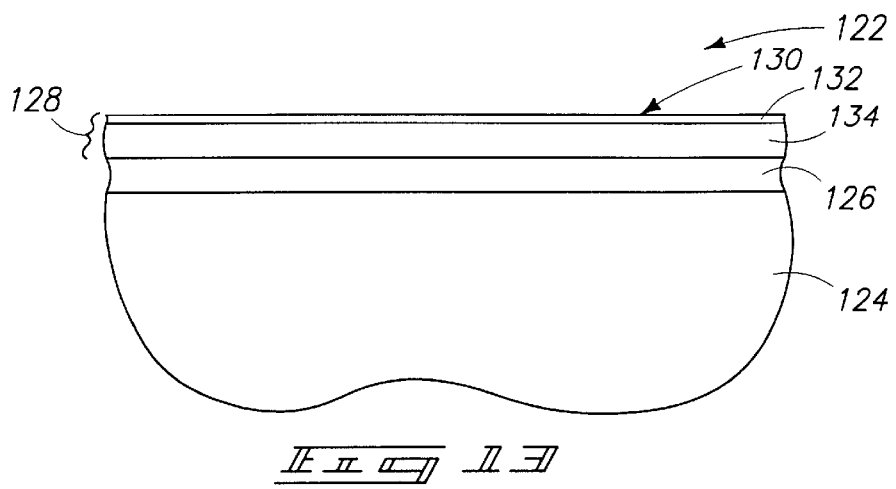
FIG. 13 is a diagrammatic sectional view of an alternate embodiment semiconductor wafer fragment at one alternate processing step in accordance with the invention.

An alternate embodiment 122 is described with reference to FIGS. 13 and 14. Such comprises a substrate composed of bulk monocrystalline silicon 124 and an overlying $SiO_2$ layer 126. An outer predominantly nitride layer 128 is provided over $SiO_2$ layer 126. Such also includes an outer surface 130, the immediately underlying portion thereof which has been transformed to an oxidized material 132, preferably $SiO_2$. Bulk mass 134 of layer 128 constitutes $Si_3N_4$. The processing to produce materials 134 and 132 preferably is again conducted in a single, common chemical vapor deposition reactor.

Material 132 relative to outer surface 130 is preferably provided by feeding a gaseous oxygen containing precursor to the reactor under conditions effective to oxidize $Si_3N_4$ material 134 to $SiO_2$ material 132. One example process for accomplishing such transformation of outer surface 130 is to cease feeding the dichlorosilane and ammonia precursors as described in the above example, and purging the reactor of such gaseous precursors. Immediately thereafter, $N_2O$, $O_2$, $O_3$, or mixtures thereof are fed to the reactor under the same temperature and pressure conditions which effectively causes the outer surface of the nitride material to become oxidized to $SiO_2$. The thickness of material 132 is preferably kept very low, such as from about 10 Angstroms to about 30 Angstroms. Purging of the $Si_3N_4$ precursors is highly desirable to prevent an undesired silicon dust from falling out onto the wafer as may occur without purging, which neither produces the $SiO_2$ material of this example, nor readily adheres to the underlying substrate.

An example processing for $O_3$, would be at atmospheric or subatmospheric pressure at a temperature of 600° C. for from one to two hours. For $O_2$, an example oxidizing condition would be feeding both $O_2$ and $H_2$ at atmospheric pressure and temperatures ranging from 800° C. to 1100° C. for from 30 minutes to two hours.

Alternately but less preferred, the above processing could take place in two separate chambers, with the wafer(s) being moved from one to the other after provision of the nitride layer for subsequent provision of the adhesion promoting layer.

Figure 14:
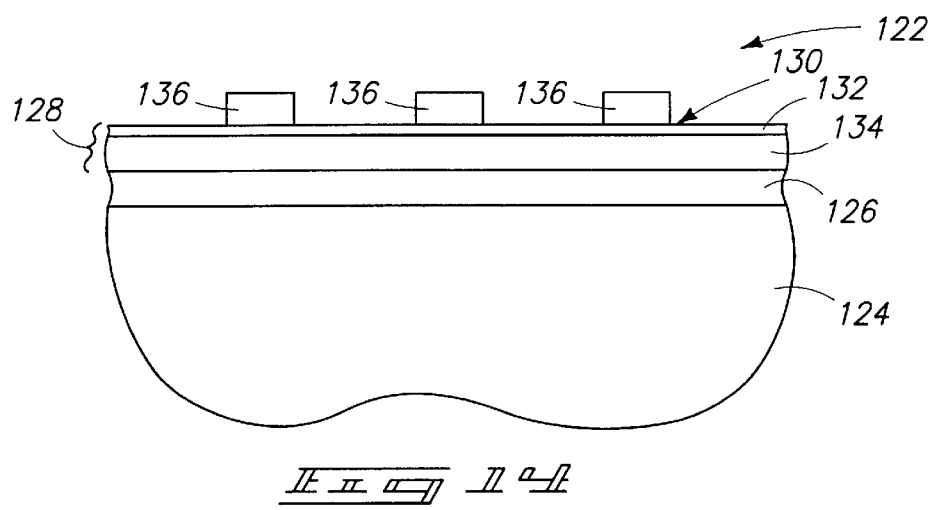
FIG. 14 is a view of the FIG. 13 wafer fragment at a processing step subsequent to that shown by FIG. 13.

Referring to FIG. 14, a layer of photoresist is deposited and patterned to produce photoresist blocks 136, as in the first described embodiment. The photoresist adheres to $Si_3N_4$ layer 128 with a greater degree of adhesion than would otherwise occur if the outer $Si_3N_4$ surface 130 were not oxidized.

Figure 15:
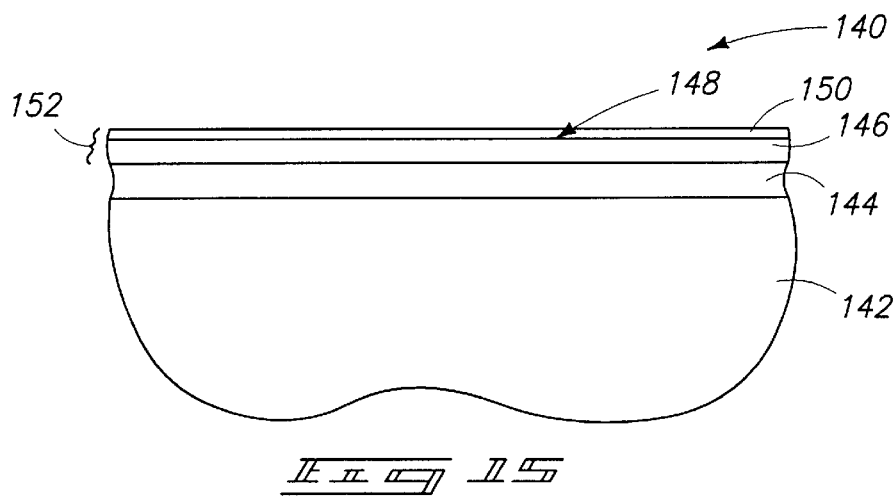
FIG. 15 is a diagrammatic sectional view of yet another alternate embodiment semiconductor wafer fragment at yet another alternate processing step in accordance with the invention.

Other alternate examples are described with reference to FIG. 15, illustrating a semiconductor wafer fragment 140. Such again comprises a substrate composed of a bulk monocrystalline silicon substrate 142 and overlying $SiO_2$, layer 144. An overlying layer 146 of $Si_3N_4$ is provided, preferably as described above with respect to the other embodiments. Nitride layer 146 has an outer surface 148. Subsequently, conditions are provided within a chemical vapor deposition reactor to cover outer $Si_3N_4$ surface 148 with a discrete photoresist adhesion layer 150 having a thickness of preferably from about 10 Angstroms to about 30 Angstroms. Thus, an outer composite substrate layer 152 is provided which predominantly comprises $Si_3N_4$. Example and preferred materials for thin discrete photoresist adhesion layer 150 are silicon or $SiO_2$.

Silicon can be deposited by any typical or known process for depositing polycrystalline silicon atop a semiconductor wafer. An example and preferred method for providing layer 150 to constitute $SiO_2$ is to first purge the reactor after $Si_3N_4$ layer deposition, followed by feeding of DCS and $N_2O$ to the reactor under temperature conditions of 780° C. and 250 mTorr at a volumetric ratio of DCS:$N_2O$ of from 1:3 to 1:10. Subsequently provided photoresist will adhere to $Si_3N_4$ layer 152 with a greater degree of adhesion than would otherwise occur if the intermediate silicon, $SiO_2$, or other adhesion promoting layer were not present.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor wafer assembly, comprising:
a silicon oxide material having a surface,
a silicon nitride material having a surface, the silicon nitride material being over and physically contacting the surface of the silicon oxide material;
a barrier layer over and physically contacting the surface of the silicon nitride material, the barrier layer comprising silicon, oxygen and nitrogen, the silicon nitride material being greater than 1% of the combined silicon nitride material and barrier layer: and
a photoresist over and physically against the barrier layer.

2. The semiconductor wafer assembly of claim 1 wherein the barrier layer comprises silicon oxynitride.

3. A semiconductor wafer assembly, comprising:
a silicon oxide material having a surface,
a silicon nitride material having a surface, the silicon nitride material being over and physically contacting the surface of the silicon oxide material;
a barrier layer over and physically contacting the surface of the silicon nitride material, the barrier layer comprising a silicon nitride layer having a higher stoichiometric amount of silicon than the silicon nitride material, the silicon nitride material being greater than 1% of the combined silicon nitride material and barrier layer; and
a photoresist over and physically against the barrier layer.

4. The semiconductor wafer assembly of claim 3 wherein the barrier layer comprises $Si_xN_y$, wherein x is greater than or equal to y.

5. A semiconductor wafer assembly, comprising:
a silicon oxide layer:
a silicon nitride material over and physically against the silicon oxide layer, the silicon nitride material having a surface and comprising a nitrogen diffusion barrier at the surface, the barrier comprising silicon, oxygen and nitrogen, the silicon nitride material being greater than 1% of the combined barrier and silicon nitride material; and
a photoresist over and physically against the barrier.

6. The semiconductor wafer assembly of claim 5 wherein the barrier comprises silicon oxynitride.

7. A semiconductor wafer assembly comprising:
a silicon oxide layer;
a silicon nitride material over and physically against the silicon oxide layer, the silicon nitride material having a surface and comprising a nitrogen diffusion barrier at the surface, the silicon nitride material being greater than 1% of the combined barrier and silicon nitride material, wherein the barrier comprises $Si_xN_y$ and a remainder of the silicon nitride material comprises $Si_sN_t$, a ratio of x to y being greater than a ratio of s to t; and
a photoresist over and physically against the barrier.

8. A semiconductor wafer assembly, comprising:
a silicon oxide layer;
a silicon nitride material over and physically against the silicon oxide layer, the silicon nitride material having a surface and comprising a nitrogen diffusion barrier at the surface, the barrier comprising silicon and nitrogen, the silicon nitride material being greater than 1% of the combined barrier and silicon nitride material, wherein the barrier comprises a greater concentration of silicon than a remainder of the silicon nitride material; and
a photoresist over and physically against the barrier.

9. A semiconductor wafer assembly, comprising:
a silicon substrate;
a silicon oxide layer over and physically contacting the silicon substrate;
a silicon nitride material over and physically contacting the silicon oxide layer;
a barrier layer over and physically contacting the silicon nitride material, the barrier layer comprising silicon, oxygen and nitrogen, wherein the silicon nitride material is greater than 1% of the combined barrier layer and silicon nitride material; and
a photoresist over and physically against the barrier layer.

10. The semiconductor wafer assembly of claim 9 wherein the barrier layer comprises silicon oxynitride.

11. A semiconductor wafer assembly, comprising:
a silicon substrate:
a silicon oxide layer over and physically contacting the silicon substrate;
a silicon nitride material over and physically contacting the silicon oxide layer;
a barrier layer over and physically contacting the silicon nitride material, the barrier layer comprising a silicon nitride layer having a higher stoichiometric amount of silicon than the silicon nitride material, wherein the silicon nitride material is greater than 1% of the combined barrier layer and silicon nitride material; and
a photoresist over and physically against the barrier layer.

12. The semiconductor wafer assembly of claim 11 wherein the barrier layer comprises $Si_xN_y$, wherein x is greater than or equal to y.

* * * * *

UNITED STATES PATENT AND TRADEMARK OFFICE
CERTIFICATE OF CORRECTION

PATENT NO. : 6,693,345 B2
DATED : February 17, 2004
INVENTOR(S) : John T. Moore et al.

It is certified that error appears in the above-identified patent and that said Letters Patent is hereby corrected as shown below:

Column 1,
Line 34, replace "example, silicon dioxide, and is can thus be utilized as an" with
-- example, silicon dioxide, and can thus be utilized as an --

Column 3,
Line 55, replace "photography. In photolithograpy, the required pattern is first" with
-- photography. In photolithography, the required pattern is first --
Line 58, replace "Inherent in photolithograpy is application and adherence" with
-- Inherent in photolithography is application and adherence --

Signed and Sealed this

Twelfth Day of October, 2004

JON W. DUDAS
*Director of the United States Patent and Trademark Office*